United States Patent
Tarantino et al.

(10) Patent No.: US 9,016,590 B2
(45) Date of Patent: Apr. 28, 2015

(54) METHOD FOR MANUFACTURING A DATA CARRIER BODY FOR A PORTABLE DATA CARRIER AND DATA CARRIER BODY

(75) Inventors: Thomas Tarantino, Laufen (DE);
Walter Ponikwar, Burghausen (DE);
Tobias Salzer, Unterhaching (DE);
Günter Endres, München (DE);
Cristina Schellenberger, Garching (DE)

(73) Assignee: Giesecke & Devrient GmbH, Munich (DE)

( * ) Notice: Subject to any disclaimer, the term of this patent is extended or adjusted under 35 U.S.C. 154(b) by 24 days.

(21) Appl. No.: 13/807,803

(22) PCT Filed: Jun. 16, 2011

(86) PCT No.: PCT/EP2011/002984
§ 371 (c)(1),
(2), (4) Date: Dec. 31, 2012

(87) PCT Pub. No.: WO2012/000615
PCT Pub. Date: Jan. 5, 2012

(65) Prior Publication Data
US 2013/0099003 A1 Apr. 25, 2013

(30) Foreign Application Priority Data
Jul. 1, 2010 (DE) .......................... 10 2010 025 774

(51) Int. Cl.
*G06K 19/06* (2006.01)
*B32B 37/12* (2006.01)
*G06K 19/077* (2006.01)

(52) U.S. Cl.
CPC ...... *B32B 37/1284* (2013.01); *G06K 19/07722* (2013.01); *G06K 19/07728* (2013.01); *G06K 19/07745* (2013.01); *G06K 19/07749* (2013.01); *H01L 2924/0002* (2013.01)

(58) Field of Classification Search
CPC .......................... G06K 19/0723; G06K 19/077
USPC ................................................. 235/487, 492
See application file for complete search history.

(56) References Cited

U.S. PATENT DOCUMENTS 4,417,413 A * 11/1983 Hoppe et al. ..................... 40/630
5,735,040 A * 4/1998 Ochi et al. ....................... 29/841

(Continued)

FOREIGN PATENT DOCUMENTS

DE 19921230 A1 11/2000
WO 03054699 A2 7/2003

(Continued)

OTHER PUBLICATIONS

Haghiri et al., "Vom Plastik zur Chipkarte; 7.2 Kontaktlaose Chipkarte," XP002364832, pp. 181-192, Munich (1999).

(Continued)

*Primary Examiner* — Paultep Savusdiphol
(74) *Attorney, Agent, or Firm* — Workman Nydegger

(57) ABSTRACT

A method for producing a data storage medium body for a portable data storage medium having a core layer and at least one top layer, wherein the core layer contains a chip module. The chip module has a surface which is adverse to lamination and has an adhesive deposit applied on the module surface; a recess is provided in the core layer and the chip module is inserted into the recess such that the module surface having the adhesive deposit is situated towards the open side of the recess; a top layer is applied over the module surface; then the above arrangement is laminated. The adhesive deposit combines intimately with the adjoining top layer.

10 Claims, 2 Drawing Sheets

(56) References Cited

U.S. PATENT DOCUMENTS

| | | | |
|---|---|---|---|
| 5,969,951 A * | 10/1999 | Fischer et al. | 361/737 |
| 6,139,664 A * | 10/2000 | Melzer et al. | 156/73.1 |
| 6,305,609 B1 * | 10/2001 | Melzer et al. | 235/487 |
| 6,440,773 B1 * | 8/2002 | Usami | 438/107 |
| 6,651,891 B1 * | 11/2003 | Zakel et al. | 235/487 |
| 6,659,355 B1 * | 12/2003 | Fischer et al. | 235/492 |
| 7,244,326 B2 * | 7/2007 | Craig et al. | 156/234 |
| 7,842,152 B2 * | 11/2010 | Hamilton et al. | 156/227 |
| 8,368,538 B2 * | 2/2013 | Rexer et al. | 340/572.1 |
| 2002/0195195 A1 * | 12/2002 | Grabau et al. | 156/300 |
| 2004/0031855 A1 | 2/2004 | Takahashi | |
| 2004/0078957 A1 * | 4/2004 | Forster et al. | 29/601 |
| 2004/0188010 A1 * | 9/2004 | Chaoui | 156/269 |
| 2005/0000634 A1 * | 1/2005 | Craig et al. | 156/230 |
| 2005/0091821 A1 * | 5/2005 | Best et al. | 29/430 |
| 2005/0205202 A1 * | 9/2005 | Chaoui et al. | 156/269 |
| 2007/0176273 A1 * | 8/2007 | Wolny | 257/679 |
| 2008/0117056 A1 * | 5/2008 | Forster | 340/572.7 |
| 2008/0202300 A1 * | 8/2008 | Steidinger et al. | 83/39 |
| 2009/0072974 A1 * | 3/2009 | Miyashita et al. | 340/572.1 |
| 2009/0151150 A1 * | 6/2009 | Ayala et al. | 29/600 |
| 2010/0032487 A1 * | 2/2010 | Bohn et al. | 235/492 |
| 2010/0134294 A1 * | 6/2010 | Rexer et al. | 340/572.8 |
| 2010/0252637 A1 * | 10/2010 | Bouchard | 235/488 |

FOREIGN PATENT DOCUMENTS

| | | |
|---|---|---|
| WO | 2007089140 A1 | 8/2007 |
| WO | 2009135823 A1 | 11/2009 |

OTHER PUBLICATIONS

International Search Report application No. PCT/EP2011/002984 dated Sep. 16, 2011.
International Preliminary Report on Patentability and Written Opinion in PCT/EP2011/002984, Jan. 8, 2013.

* cited by examiner

FIG 4
FIG 5
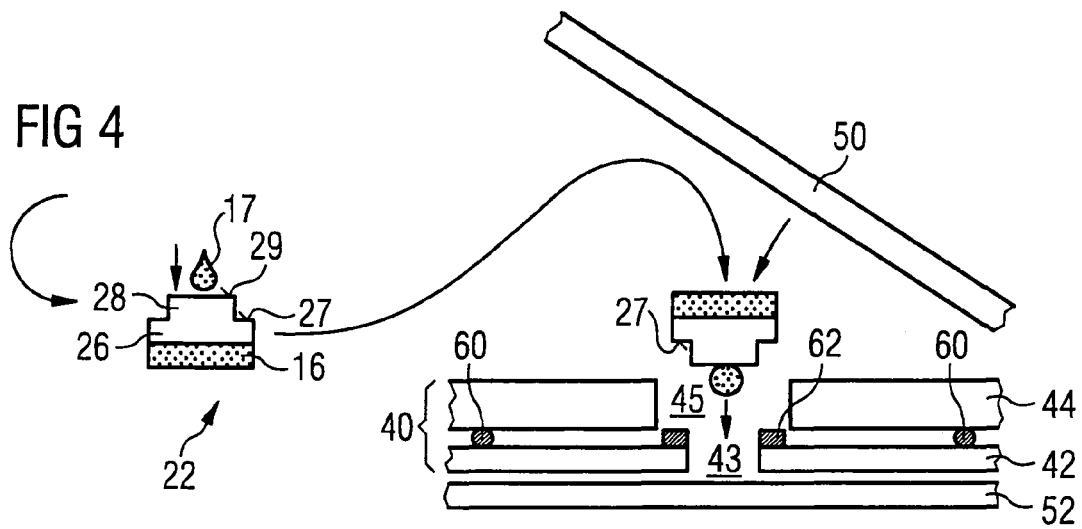
FIG 6
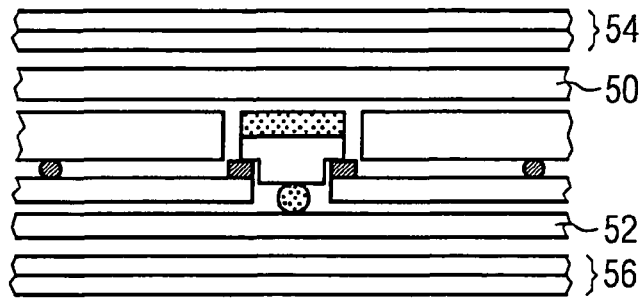
FIG 7
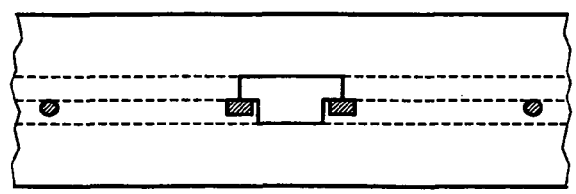

METHOD FOR MANUFACTURING A DATA CARRIER BODY FOR A PORTABLE DATA CARRIER AND DATA CARRIER BODY

BACKGROUND OF THE INVENTION

A. Field of the Invention

This invention relates to a method and an object according to the species of the independent claims. The invention relates in particular to a method for manufacturing a contactlessly readable identification document with integrated IC, which can be used as an identity card or as a data page in a passport booklet, as well as to a corresponding identification document.

B. Related Art

Identification documents such as identity cards or passports are increasingly provided with transponder arrangements which consist of a chip module, which contains an IC, and an antenna connected therewith. These chip-coil arrangements allow the data stored in the IC to be contactlessly read. The manufacturing of such identification documents is typically effected by laminating at least one core layer and two cover layers, the chip-coil arrangement being integrated into the core layer. A problem with respect to the durability of such identification documents is the bond between the IC-module and the document body. The two consist of different materials, the module material is hard and high-melting, while the material employed for the document body is comparatively soft and readily laminatable. The different material consistence of IC-module and document body, upon long-term use of a corresponding identification document, sometimes leads to the formation of cracks—emanating from the border region between chip module and document body—in the bordering layers. The cracks spread into the cover layer lying next and impair appearance and mechanical stability of the identification document.

In order to prevent such cracks in portable data carriers used as identification documents, it has been proposed in WO 2007/089140 A1 to provide a further layer between module upper side and cover layer, and to provide a non-continuous auxiliary layer insert between the further layer and the cover layer, which is slightly larger than the module upper side and consists of a rubberlike material with a particularly high coefficient of expansion. The auxiliary layer insert makes sure that cracks possibly emanating from the transition region between module and core layer do not spread into the cover layer in any case. An analogous auxiliary layer insert can also be provided for the narrower underside of the module.

From WO 2009/135823 A1 there can be inferred, likewise for the purpose of eliminating the development of cracks, a structure for a multilayer body of an identification document, in which individual layers contain inserts made of a softer material. A chip module to be integrated into the document body is now arranged exactly in such a patch made of softer material. The extension of the patch here is larger than the module. Upon laminating, the softer material then flows completely around the module and embeds it form-fittingly. In this way, stress zones leading to cracks can be prevented. Realizing the patchwork-like layers is elaborate, however.

From DE 199 21 230 A1 there is known a method for manufacturing a chip card with direct use of a thinned chip instead of an otherwise usual chip module. The chip is manufactured in a wafer and placed at the component side with interposition of a detachable interim adhesive on a carrier band where it is thinned from the back. After removal of the interim adhesive, the thinned chip is inserted in a cavity prepared in a chip card body. In so doing, it is fixed in the cavity with the aid of a further adhesive applied for this purpose on the back of the chip. Onto the component side there is then laminated a chip card foil, on which there are formed conductor paths which contact the component side of the thinned chip. The problem of a possible cracking does not exist with especially thinned chips, because in the finished card body they occupy with their minimum thickness and their small area only a very small installation space, from which there do not emanate any crack-forming disruptions. The handling of the chips, however, is very elaborate in comparison to the handling of chip modules.

In the book, "Vom Plastik zur Chipkarte" by Y. Haghiri, T. Tarantino, Carl Hanser Verlag, Munich, 1999, there are described manufacturing methods for chip cards, in particular the lamination technique.

It is the object of the invention to state a method which allows crack-resistant data carriers to be manufactured without substantial interventions in the lamination process.

SUMMARY OF THE DISCLOSURE

The method according to the invention has the advantage that changes in the course of the method need to be made only in the preparation of the chip modules for the installation in a data carrier body, while the subsequent lamination process itself can be carried out in the same way as the lamination of usual data carriers which are not particularly designed to crack resistance.

The method according to the invention furthermore has the advantage, that it allows modules to be effectively integrated in data carrier bodies which actually have surfaces adverse to lamination. Among other things, it becomes possible to integrate modules with metallic upper sides or modules with non-stickingly configured surfaces into a data carrier body such that the chip module and all the layers form a continuous strong composite.

In an advantageous embodiment of the method according to the invention, the chip modules are provided, before the lamination, with an insert of an adhesive that is coordinated in exact register with their surface, which adhesive, upon lamination, enters into an intimate connection both with the bordering continuous layer and with the chip module surface adverse to lamination. The adhesive preferably is a so-called hot-melt adhesive.

Advantageously, the adhesive for producing the adhesive insert is made available in a two-layer adhesive band which consists of a detachable handling layer and the actual adhesive layer. The handling layer is removed after application of the adhesive band on the chip module. In this way, the adhesive band can advantageously be made available in roll form and processed therefrom.

In an advantageous embodiment, the chip modules are first located in a module carrier band and likewise are made available in roll form. Bringing together adhesive band and module carrier band can thus be realized particularly efficiently.

In a particularly advantageous use, the method according to the invention is suitable for manufacturing a contactlessly readable identification document with integrated IC, which can be used as an identity card or as a data page in a passport booklet.

DESCRIPTION OF THE DRAWINGS

An embodiment of the invention will hereinafter be explained more closely with reference to the drawing.

There are shown.

DETAILED DESCRIPTION OF EXEMPLARY EMBODIMENTS

The manufacturing method described below is basically divided in a preparation phase in which the chip module as well as the further layers and components of a data carrier body are made available, and a lamination process in which the constituents made available are permanently connected with each other by lamination, i.e. by applying pressure and heat. There is manufactured a multilayer, flat, portable plastic data carrier body, which serves either as an inlay for a ready-to-use data carrier or already is a finished data carrier. A ready-to-use data carrier serves e.g. as an identification document, for instance as an electronic identity card or as an electronic passport.

Figure 1:
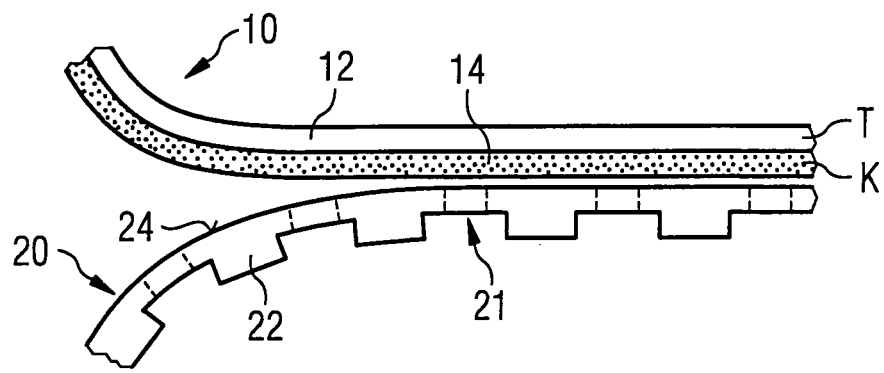
FIG. 1 in cross section, bringing together a module carrier band and an adhesive band, FIG. 2 in cross section, a module carrier band, after connection with the adhesive band, upon detaching the handling layer, FIG. 3 in cross section, a module carrier band with applied adhesive layer, before the singling by means of a punching tool, FIG. 4 a singled chip module provided with an adhesive insert, upon metering a contact adhesive onto the back of the module, FIG. 5 in cross section, a layer stack consisting of layers to be laminated for manufacturing a data carrier body, together with a chip module provided with adhesive insert and contact adhesive, upon inserting the chip module in the recess, FIG. 6 in cross section, an arrangement of layers to be laminated for manufacturing a portable data carrier with inserted chip module, before lamination, and FIG. 7 in cross section, a portable data carrier of plastic material, after lamination.

FIG. 1 shows the first step of the preparation phase, in which a two-layer adhesive band 10 and a module carrier band 20 are connected to each other. The adhesive band 10 consists of a handling foil 12 and an adhesive layer 14. The handling foil 12 adheres only slightly to the adhesive layer 14 and is detachable from this. The handling foil 14 facilitates the handling of the adhesive band 10; it is accordingly dispensable when the constitution of the adhesive layer 14 allows this or suitable means are available that allow a direct handling of the adhesive layer 14. The adhesive forming the adhesive layer 14 is preferably a hot-melt adhesive which is coordinated to the surface of the module carrier band 20 and first of all adheres to this surface in the region of the chip modules 22. The melting temperature of the hot-melt adhesive expediently lies in the range of 100° C. to 150° C., preferably in the range of 110° C. to 120° C.

The surface of the module carrier band 20 is often adverse to lamination, i.e. it enters into no, or only a poor connection, with the next adjacent plastic layer under the usual card-laminating conditions under which the plastic layers placed together for the usual card manufacturing connect. The softening point of the surface of the module carrier band 20 lies at least in certain regions above the temperature at which the further layers used for constructing an inlay or a data carrier enter into a connection upon lamination.

The module carrier band 20 carries chip modules 22 arranged in one or several rows, which expediently were constructed directly on the module carrier band 20, so that the surfaces 24 of the chip modules 22 are part of that surface of the module carrier band 20 which faces the adhesive band 10.

The chip modules 22 typically have a T-shaped profile with a wide head portion 26 with the surface 24 and a, in comparison, narrower base portion 28 with the underside 29. The surface 24 normally has a noticeable extension which can amount to e.g. some mm$^2$. The edge contour of the surface 24 is normally formed, due to production-related reasons, by a sharp—in contrast to a rounded—edge sloping in a 90°-angle. The head portion 26 typically contains metallic structures, which serve for example as conductor paths or contact areas. The metallic structures are in particular also part of the surface 24 of the head portion 26. Metallic structures which likewise serve in particular as conductor paths and/or contact areas are further also located at the underside shoulder areas 27 in the protrusion region of the head portion 26. They later serve for the electrical connection of the chip module 22 with a coil, antenna or any other conductor structure.

In an expedient manufacturing technique the module carrier band 20 and the chip modules 22 formed therein are based on the so-called lead-frame technique. The module carrier band 20 here is formed by a metal band, in which a layout is produced by incorporating corresponding recess structures. In an alternative manufacturing technique the module carrier band 20 consists of a fiber-reinforced polymer, for instance a so-called FR4-material, which can be coated on one or on both sides with a conductive material, in which a layout is created. The conductive material can be for example a copper foil that has a nickel/gold coating applied thereon.

The individual chip modules 22 are normally pre-separated by a perforation or pre-notching or comparable predetermined separating structure 21, bordering the contour, from the module carrier band 20, so that a subsequent final detaching is facilitated. The base 28 of the chip module 22 normally includes one or several ICs and is typically formed by a plastic encapsulation created around the one or more ICs. The encapsulation consists of a high-melting plastic material, which does not soften during the subsequent lamination.

Adhesive band 10 and module carrier band 20 are expediently made available on rolls and starting out therefrom are brought together for connection such that the adhesive layer 14 comes to lie on that side of the module carrier band 20 which contains the surfaces 24 of the head portions 26 of the chip modules 22. The connection of adhesive band 10 and module carrier band 20 is effected under pressure and at a temperature, coordinated to the adhesive layer 14, which activates the adhesive.

Figure 2:
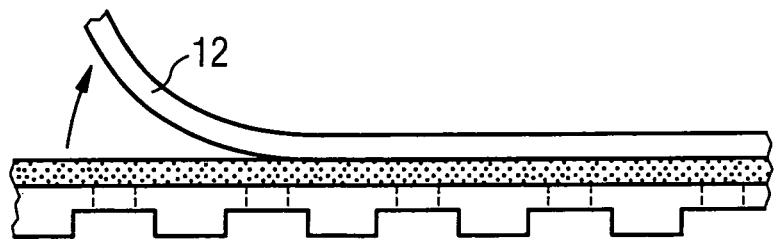

After the connection of adhesive band 10 and module carrier band 20, the handling foil 12 is removed from the adhesive layer 14, as illustrated in FIG. 2.

Figure 3:
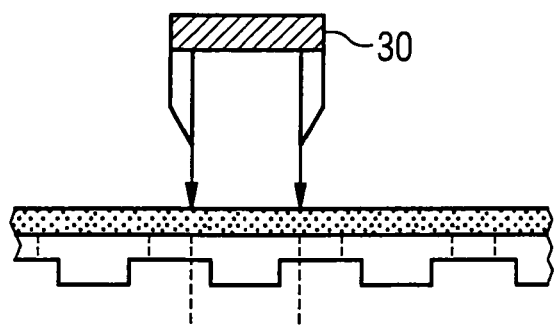

From the thereafter existing composite of module carrier band 20 and adhesive layer 14, the individual chip modules 22 are subsequently detached with the aid of a singling tool 30, as shown in FIG. 3. In so doing, the singling tool 30 separates the chip modules 22 along the predetermined separating structures 21 or, if such structures do not exist, along the circumferential contour defined for the head portion 26. In so doing, together with the chip module 22 an adhesive insert 16 is detached from the adhesive band/module carrier band composite, which covers the entire surface 24 of the head portion 26 of the chip module 22 and the edge contour of which is exactly aligned with the circumferential contour of the head portion 26. The singling tool 30 can be a punching or cutting tool, as indicated in FIG. 3. The singling can also be readily effected by means of laser, by means of water jet, or with other suitable tools.

On the underside 29 of the chip module 22, which has been singled and provided with an adhesive insert 16, in the following step a contact adhesive 17 is applied, as shown in FIG.

4. This application is expediently effected by metering a liquid adhesive. As an adhesive there is employed a usual contact adhesive, here. The thereafter existing chip module 22 carries on its surface 24 an adhesive insert 16 matching the contours of the surface and on its underside 29 a contact adhesive 17.

As an alternative to the application on the underside 29 of the chip module 22, the contact adhesive 17 can also be metered into the recess 43, in which the chip module 22 is subsequently inserted.

The chip module 22 is subsequently inserted, as illustrated in FIG. 5, in a layer stack prepared for the lamination. The total height of the layer stack is greater than that of the chip module 22, so that this can be completely accommodated in the layer stack, but not so great, however, that the height of the chip module 22 could be neglected; the height of the chip module 22 typically amounts to between 10% and 90% of the total height of the layer stack.

The layer stack consists of a multilayer core layer 40 as well as of respectively at least one upper cover layer 50 and one lower cover layer 52. The cover layers 50, 52 are continuous, i.e. they cover the entire surface area of the data carrier body, consist of a usual suitable plastic material, e.g. of polycarbonate (PC), and respectively have a thickness of e.g. 30 µm. In the embodiment, the core layer 40 in turn consists of two partial core layers 42, 44, wherein the first partial core layer 42 e.g. in turn consists of polycarbonate (PC) and has a thickness of e.g. 105 µm, and the second partial core layer 44 likewise e.g. consists of polycarbonate and has a thickness of e.g. 150 µm. The thicknesses of the partial core layers 42, 44 here are adapted to the chip module 22. Instead of polycarbonate, the partial core layers 42, 44 can also consist of a different usual plastic material. The first partial core layer 42 further has a recess 43, the second partial core layer 44 a, in comparison, wider recess 45. Both recesses 43, 45 together form at least approximately a negative of the outer contour of the chip module 22 coated with the adhesive insert 16.

On the first partial core layer 42 there is arranged a coil 60. It can be configured as a wire conductor or printed conductor path or also be etched. The coil 60 has connecting contacts 62 which are arranged on the surface regions protruding relative to the second partial core layer 44, so that they are openly accessible for a later contacting.

Expediently, the lower cover layer 52 is made available together with the partial core layers 42, 44 and the recesses 43, 45, as indicated in FIG. 5, so that the recesses 43, 45 form a downwardly closed two-step recess. In the partial core layers 42, 44 arranged one over the other the chip module 22 is inserted in the two-step recess 43, 45 such that the shoulders 27 come to lie on the contacts 62 of the coil 60 and the module surface 24 provided with the adhesive insert 16 lies facing the upper open side of the recess 43, 45. The surface of the adhesive insert 16 on the chip module 22 is here preferably flush with the surface of the partial core layer 44 or is dimensioned such that it is in any case aligned with the surface of the partial core layer 44 after the subsequent lamination, except for allowable tolerances as typically specified by relevant standards or specifications. The surface of the adhesive insert 16 and the surface of the partial core layer 44 thus together form a consistently planar area which has the upper cover layer 50 arranged thereon. Thus, the upper cover layer 50 itself is accordingly completely planar.

Alternatively, the insertion of the chip module 22 can also be effected first, before the resulting arrangement is subsequently covered with the upper and the lower cover layer 50, 52. It is also possible to connect the partial core layers 42, 44 and the lower cover layer 52 to each other in a preparatory lamination step, so that the two recesses 43, 45 form a stepped contiguous recess, in which the chip module 22 is inserted. Instead of two partial core layers 42, 44, also a larger number of partial core layers can be provided. It is also possible to use a single pre-manufactured core layer 40 which contains coil 60 and connecting contacts 62 and in which a suitable recess 43, 45 was incorporated e.g. by milling. Upon installation of the chip module 22 in the arrangement formed by the partial core layers 42, 44 and the lower cover layer 52, the module 22 adheres at its underside 29, with the aid of the contact adhesive 17 applied thereon, to the lower cover layer 52.

The thereafter existing arrangement can be an inlay for a portable data carrier. For completing a portable data carrier, on such an inlay arrangement there can be placed further, outer cover layers 54, 56, which serve e.g. for personalization or as a decorative or protective final layer. The further cover layers 54, 56, likewise, consist of laminatable plastic materials such as PC, PET or the like. The resulting data carrier arrangement can then e.g. consist of a total of ten layers, as shown in FIG. 6, namely the two partial core layers 42 and 44, the upper and the lower cover layer 50, 52, as well as three further upper and lower cover layers 54, 56. The cover layer 50 can be omitted when further cover layers 54, 56 are applied, in particular when the lamination is effected in one step and there is immediately manufactured a finished data carrier.

The such prepared arrangement is finally laminated. The lamination process is carried out in a per se known manner, as it is described for instance in the above-mentioned book "Vom Plastik zur Chipkarte". The surface 24 of the chip module 22 may be adverse to lamination here and under laminating conditions, under which the core layer 42, 44 and the cover layer 50 enter into a good connection, it may enter into no, or only a poor, connection with the next adjacent cover layer 50, 54.

Nevertheless, there arises a good lamination composite, which also includes the surface 24 of the chip module 22. Because upon lamination, the adhesive insert 16 located on the surface 24 of the chip module 22 intimately connects with the superjacent upper cover layer 50. Especially this intimate connection, which cannot be achieved with a simple, direct lamination of the surface 24 and the upper cover layer 50, effects that the susceptibility of the arising inlay or of the resulting data carrier to the development of cracks, which emanate from the chip module 22, in the cover layers 50 to 56 is significantly reduced.

In an expedient embodiment the lamination can be effected in one single lamination step in which all existing layers, i.e. layers 42, 44, 50, 52, 54, 56, or layers 42, 44, 50, 52, or layers 42, 44, 52, 54 are jointly connected. The temperature here lies expediently between 130 to 180° C., preferably at 175° C. to 180° C. The result is a data carrier which is usable selectively and depending on the layer sequence as an inlay or which e.g. forms already a physically finished chip card.

In a likewise expedient alternative, the lamination is effected in two steps, first an inlay is laminated of the partial core layers 42, 44, lower cover layer 50 and upper cover layer 52 at a slightly lower temperature of e.g. 160° C. to 170° C., or, if PVC is employed, at an accordingly still further reduced temperature. Then, in a second lamination step, at the same temperature, the further cover layers 54, 56 are laminated to form a finished data carrier. In this case, the further cover layers 54, 56 are placed thereon only after the inlay was laminated. There can be readily provided more than two lamination steps, in which the layers or further layers are individually laminated. The multi-step lamination is somewhat more elaborate, but allows lower temperatures to be employed and accordingly protects the IC contained in the chip module 22.

FIG. 7 shows in cross section the chip module region of a finished data carrier, as it is obtained after lamination from an arrangement shown in FIG. 6. The data carrier is characterized by the fact that, as indicated by the dashed line, the surface formed by the adhesive insert 16 and the surface of the core layer 42, 44 altogether form, towards the cover layer 50 and the following layers 54, a planar surface, except for allowable tolerances as typically specified for instance by standards or in specifications for data carriers. The data carrier therefore has at its outer side formed by the cover layer 54 a completely planar surface. The connection between the core layer 44 or the adhesive insert 16 and the cover layer 50 is consistently good here. Such a data carrier can be for example a contactlessly readable identification document with an integrated IC, which independently serves as an identity card or which is integrated as a data page into a passport booklet.

While keeping the basic concept, namely to preparatorily apply, before lamination, on the surface 24 of a chip module 22, which is per se adverse to lamination, an adhesive insert 16 for achieving in this way an intimate connection between the surface 24 and the adjacent upper cover layer 50, the above-described invention allows a number of embodiments. For instance the layer stacks shown in the FIGS. 6 and 7 can have further layers, or intermediate steps can be provided in the execution of the described procedure steps.

The invention claimed is:

1. A method for manufacturing a data carrier body having a core layer and at least one cover layer, wherein the core layer includes a chip module and the cover layer is a continuous layer, comprising the steps:
   providing a chip module,
   applying an adhesive insert on a surface of the chip module, creating a recess with an open side in the core layer,
   inserting the chip module in the recess, wherein the step of inserting the chip module in the recess is performed after the step of applying the adhesive insert so that the chip module surface provided with the adhesive insert faces towards the open side of the recess,
   applying the at least one cover layer over the module surface,
   laminating the adhesive insert, chip module, core layer and cover layer together.

2. The method according to claim 1, wherein a softening point of the chip module surface lies at least in certain regions above the temperature at which the core layer and the cover layer are bonded together upon lamination.

3. The method according to claim 1, wherein the adhesive insert is applied so as to be coordinated in exact register with the chip module surface.

4. The method according to claim 1, wherein as an adhesive for the adhesive insert, a hot-melting adhesive is employed.

5. The method according to claim 1, wherein the adhesive is made available in the form of an adhesive band comprising a carrier layer and an adhesive layer, the carrier layer being removed after application on the chip module surface.

6. The method according to claim 1, wherein the chip module is provided in a module carrier band, the chip module surface being part of the module carrier band.

7. The method according to claim 6, wherein an adhesive band is applied on the module carrier band and subsequently the chip modules are detached, respectively together with a part of the adhesive layer, from the module carrier band.

8. The method according to claim 1, wherein onto the module underside there is metered a contact adhesive before the insertion of the module in the recess.

9. A data carrier body comprising:
   at least one core layer and at least one cover layer,
   wherein in the core layer there is arranged a chip module and the cover layer is a continuous layer, and wherein the core layer and the cover layer are connected to each other by lamination,
   wherein a recess is formed in said core layer in the region of a surface of the chip module and the chip module surface is completely covered by an adhesive insert which is intimately connected with the chip module surface, and
   the cover layer, adhesive layer and core layer together define a substantially uniformly planar area on which the cover layer is arranged.

10. The data carrier body according to claim 9, wherein an upper surface of chip module surface is metallic or adverse to lamination.

* * * * *